United States Patent [19]
LeBlanc

[11] Patent Number: 5,878,250
[45] Date of Patent: Mar. 2, 1999

[54] CIRCUITRY FOR EMULATING ASYNCHRONOUS REGISTER LOADING FUNCTIONS

[75] Inventor: Marcel A. LeBlanc, Sunnyvale, Calif.

[73] Assignee: Altera Corporation, San Jose, Calif.

[21] Appl. No.: 868,612

[22] Filed: Jun. 4, 1997

Related U.S. Application Data

[60] Provisional application No. 60/043,412 Apr. 7, 1997.

[51] Int. Cl.[6] ..................................................... G06Z 13/36
[52] U.S. Cl. .......................... 395/559; 375/354; 375/370; 377/56
[58] Field of Search ............................... 395/295, 182.11, 395/275, 325, 400, 500, 551, 280, 877, 800.28, 800.01, 287; 370/475, 315; 375/370, 354, 770; 324/158.1; 315/384; 377/56

[56] References Cited

U.S. PATENT DOCUMENTS 5,230,067  7/1993  Buch ........................................ 395/275
5,787,243  7/1998  Stiffler ................................. 395/182.11

OTHER PUBLICATIONS

"1996 Data Book," Altera Corporation, Jun., 1996.

*Primary Examiner*—Thomas C. Lee
*Assistant Examiner*—John Ciccozzi
*Attorney, Agent, or Firm*—Fish & Neave; Robert R. Jackson; G. Victor Treyz

[57] ABSTRACT

Circuitry is provided that allows a register without an asynchronous loading capability to be asynchronously loaded. Logic gates are provided before and after the register. The logic gates are driven by an output signal from a storage circuit such as a latch. When the output signal has one value the logic gates act as non-inverting buffers. When the output signal has another value the logic gates act as inverters. The circuitry allows the normal synchronous operations of the register to be maintained. A hazard coverage circuit can be provided to prevent glitches from appearing at the output during asynchronous operations. The logic gates may be formed from exclusive OR gates implemented in programmable logic on a programmable logic device.

24 Claims, 10 Drawing Sheets

CIRCUITRY FOR EMULATING ASYNCHRONOUS REGISTER LOADING FUNCTIONS

This application claims the benefit of United States provisional application No. 60/043,412, filed Apr. 7, 1997.

BACKGROUND OF THE INVENTION

This invention relates to circuitry that enables registers with limited asynchronous functions to perform asynchronous loading operations.

Programmable logic devices are integrated circuits that are programmable by a user to perform various logic functions. At their most basic level, programmable logic devices contain programmable components, such as erasable programmable read-only (EPROM) transistors, electrically erasable programmable read-only (EEPROM) transistors, random access memory (RAM) transistors or cells, fuses, and antifuses. Higher level functions are provided by organizing the programmable components into groups of components. The groups of components are electrically connected to one another by programmable interconnections.

Programmable logic devices generally contain registers for temporarily holding data during logic operations. In order to conserve real estate on the die and to conserve circuit resources, it is sometimes necessary to reduce the hard-wired capabilities of such registers. For example, a register's asynchronous set function may be eliminated. Because many registers are used in the programmable logic device, even a small reduction in the real estate and circuit resources used by each register can result in a considerable savings in terms of the overall cost and complexity of the programmable logic device.

Registers with such limited asynchronous capabilities are mainly used to perform synchronous operations, so the loss of the asynchronous function is not of critical importance in most programmable logic device applications. Nonetheless, many logic designers would like to have both the asynchronous set and asynchronous clear functions available. Such an arrangement makes asynchronous loading possible, because an asynchronous set is equivalent to an asynchronous load of a 1 and an asynchronous clear is equivalent to an asynchronous load of a 0. In a register with asynchronous loading capabilities, a desired bit can be loaded into a register between clock cycles to override or replace the bit that would normally be contained in the synchronous logic stream through the register.

Although the ability to asynchronously load registers is desirable, real estate and circuit resource considerations may nevertheless dictate that registers in certain programmable logic devices have only limited asynchronous functions (e.g., only asynchronous clear capabilities). It is therefore an object of the present invention to provide an arrangement that allows registers that have limited asynchronous functions with the ability to perform asynchronous loading.

SUMMARY OF THE INVENTION

This and other objects of the invention are accomplished in accordance with the principles of the present invention by providing a circuitry that enables a register with limited asynchronous functions to perform asynchronous loading operations. If the register has only an asynchronous clear function, for example, the circuitry allows the asynchronous clear function to be selectively operated as an asynchronous set. With both asynchronous set and clear functions, the circuitry and register are able to perform asynchronous register loading operations.

The circuitry uses first and second logic gates and a storage circuit. The first logic gate is connected to the input of the register. The second logic gate is connected to the output of the register.

When the storage circuit output has one value, the first and second logic gates act as non-inverting buffers, thereby passing data through the register unchanged. This arrangement allows the register to perform normal synchronous operations when asynchronous loading is complete.

When the storage circuit output has another value, the first and second logic gates act as inverters. Data from the register is inverted by the second logic gate. If the register has only an asynchronous clear function, the ability to invert the output of the register allows the register to be asynchronously set. If the register has only an asynchronous set function, the ability to invert the output of the register allows the register to be asynchronously cleared. In either case, the additional functionality provided by the inverter of the second logic gate allows the register to be asynchronously loaded. In normal synchronous operations, the data inversion provided by the first logic gate cancels the inversion of the second logic gate.

The storage circuit used to provide signals to the first and second logic gates maintains its value until a new value is loaded. This prevents the states of the first and second logic gates from changing unexpectedly following an asynchronous operation.

The first and second logic gates can be formed from exclusive OR gates. If desired, the circuitry may be used in a programmable logic device and the first and second logic devices may be formed from programmable logic. For example, on a programmable logic device that uses look-up table logic to implement programmable logic functions, the first and second logic gates may be formed from look-up tables.

A programmable logic device containing the asynchronous loading function emulation circuitry can be used in a data processing system having a processor and memory interconnected with the programmable logic device by a common bus.

Further features of the invention, its nature and various advantages will be more apparent from the accompanying drawings and the following detailed description of the preferred embodiments.

DETAILED DESCRIPTION OF THE PREFERRED EMBODIMENTS

Figure 1:
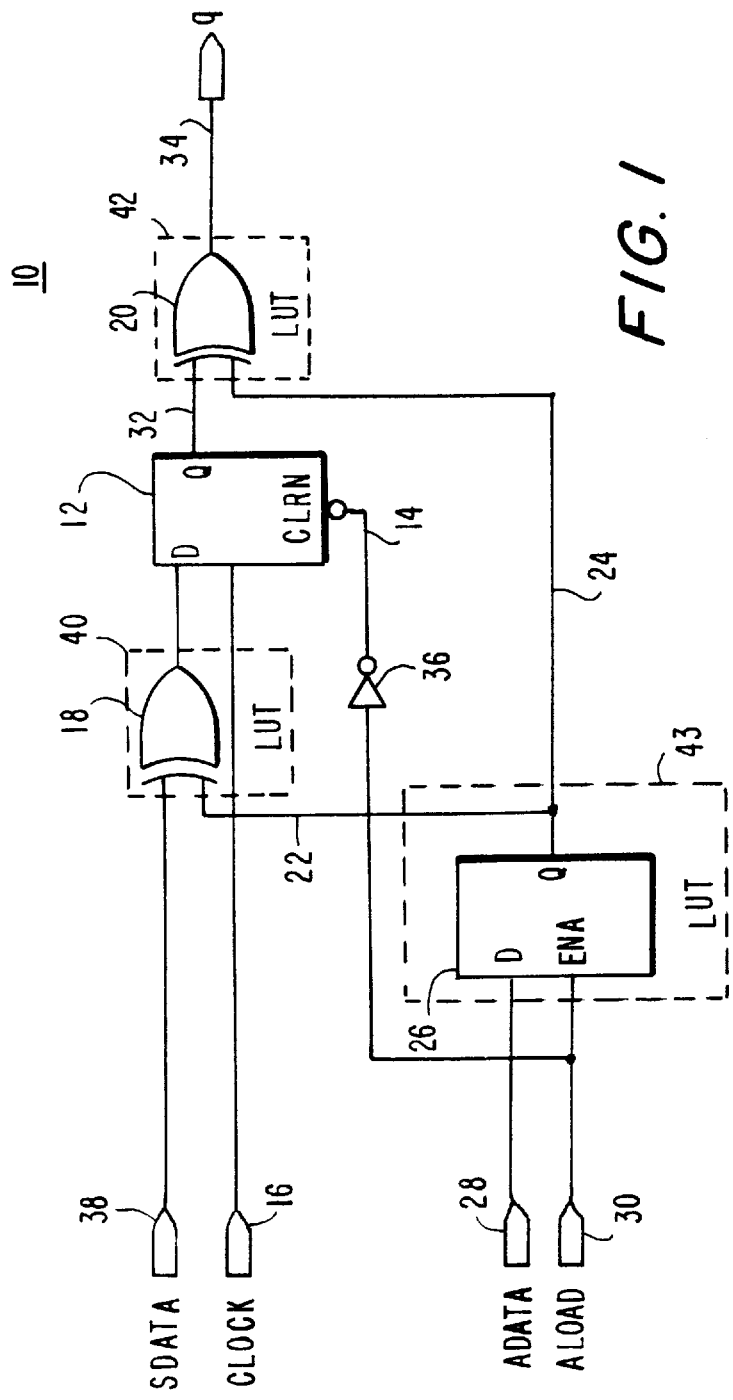
FIG. 1 is circuit diagram of a circuit for providing a register that has an asynchronous clear capability with an asynchronous loading capability in accordance with the present invention.

In logic circuitry 10 of FIG. 1, register 12 has an asynchronous clear function. Register 12 can be asynchronously cleared by causing input 14 to go low without regard to the state of the clock at clock input 16.

Register 12 does not have an asynchronous set function. However, exclusive OR gates 18 and 20, which are driven by control lines 22 and 24 from latch 26, can be used to allow the asynchronous clear of register 12 to function as an asynchronous set. The ability to both asynchronously set and asynchronously clear circuitry 10 is equivalent to the ability to asynchronously load data into circuitry 10, because an asynchronous load of a 0 can be accomplished by an asynchronous clear and an asynchronous load of a 1 can be accomplished by an asynchronous set.

To perform an asynchronous set with circuitry 10, a data input 28 of latch 26 is taken high and aload input 30 is taken high. This makes the output Q of latch 26 go high and makes exclusive OR gates 18 and 20 function as inverters. Data provided at input 32 of exclusive OR gate 20 is therefore inverted at output 34. The high aload signal at input 30 is inverted by inverter 36 and takes input 14 low, thereby clearing register 12. Clearing register 12 makes the Q output of register 12 low. However, because exclusive OR gate 20 is acting as an inverter, the low signal at the Q output of register 12 is inverted, so that the q signal at output 34 is high. Taking aload high while holding adata high therefore causes circuitry 10 to perform an asynchronous set operation. (i.e., a 1 has been loaded asynchronously).

After the q signal at output 34 has been asynchronously set (i.e., the 1 has been loaded), aload may be returned to low. With aload low, the Q output of latch 26 will remain high, regardless of the value of adata. So long as the Q output of latch 26 is high, exclusive OR gate 18 acts as an inverter. Because the inversion operation of exclusive OR gate 18 effectively cancels the inversion operation of exclusive OR gate 20, the normal synchronous behavior of register 12 is preserved. As a result, synchronous data at sdata input 38 is processed by circuitry 10 just as though circuitry 10 were a normal synchronous register. For example, if the sdata signal at input 38 is high, exclusive OR gate 18 inverts this signal so that a low is stored in register 12 (e.g., when a rising clock edge is detected on input 16). The low signal stored in register 12 is provided at the Q output of register 12. Exclusive OR gate 20 inverts the Q data output of register 12, so that the signal at q output 34 is once again high. Similarly, if sdata is low at input 36, exclusive OR gate 18 inverts this data so that a high is stored in register 12 (e.g., when a rising clock edge is detected on input 16). Exclusive OR gate 20 inverts the Q data output of register 12, so that the signal at q output 34 is once again low.

To perform an asynchronous clear of circuitry 10 (i.e., to asynchronously load a 0), adata is made low at input 28 of latch 26 while aload at input 30 is taken high. This makes the output Q of latch 26 go low and makes exclusive OR gates 18 and 20 function as non-inverting buffers. The high aload signal at input 30 is inverted by inverter 36 and takes input 14 low, thereby clearing register 12. Clearing register 12 makes the Q output of register 12 low. Because exclusive OR gate 20 is acting as a non-inverting buffer, the low signal at the Q output of register 12 is passed through exclusive OR gate 20 unchanged, so that the q signal at output 34 is low. Taking aload high while holding adata low therefore causes circuitry 10 to perform an asynchronous clear operation (i.e., an asynchronous load of a 0).

After the q signal at output 34 has been asynchronously cleared, aload may be returned to low. With aload low, the Q output of latch 26 will remain low, regardless of the value of adata. So long as the Q output of latch 26 is low, exclusive OR gate 18 acts as a non-inverting buffer. Because exclusive OR gate 18 also acts as a non-inverting buffer, the normal synchronous behavior of register 12 is preserved. As a result, synchronous data at sdata input 38 is processed by circuitry 10 as though circuitry 10 were a normal synchronous register. For example, if the sdata signal at input 38 is high, exclusive OR gate 18 passes this signal unchanged, so that a high is stored in register 12 (e.g., when a rising clock edge is detected on input 16). Exclusive OR gate 20 passes the Q data output of register 12 to q output 34 unchanged, so that the signal at q output 34 is also high. Similarly, if sdata is low at input 38, exclusive OR gate 18 passes this data unchanged, so that a low is stored in register 12. Exclusive OR gate 20 passes the Q data output of register 12 to output 34 unchanged, so that the signal at q output 34 is also low.

If desired, some of the circuitry in circuitry 10 other than register 12 can be formed using programmable logic. For example, programmable look-up tables 40, 42, and 43 may be used to implement the functions of exclusive OR gates 18 and 20 and latch 26. When programmable logic is used on a circuit, programmable circuit resources can be used for various purposes when it is not necessary to use such programmable logic resources to emulate asynchronous features.

Figure 2:
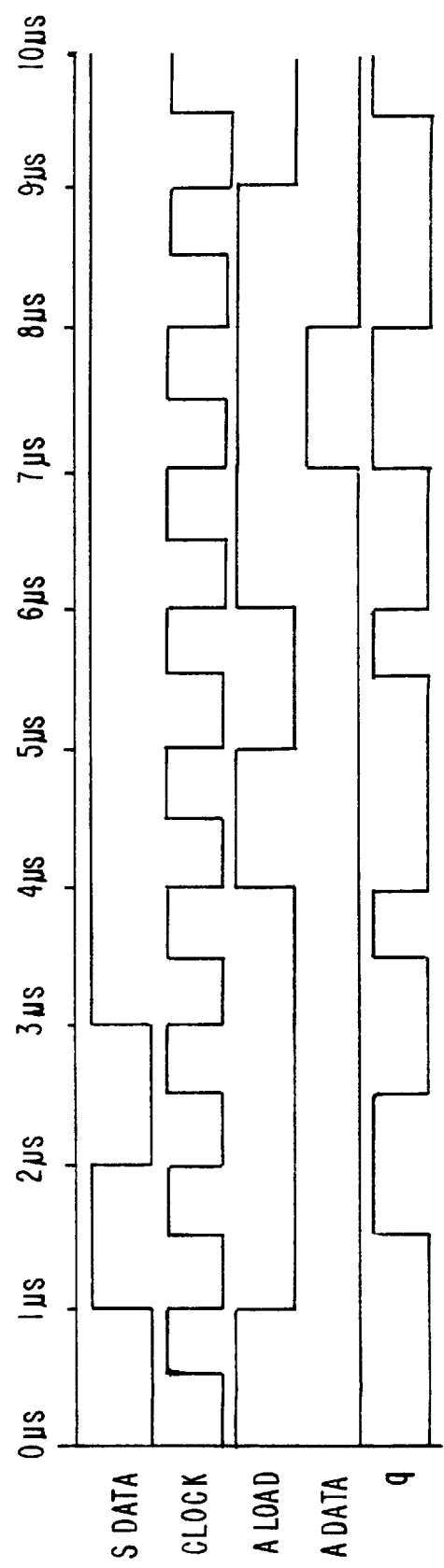
FIG. 2 is a timing diagram showing the operation of the circuit of FIG. 1.

A timing diagram illustrating the operation of circuitry 10 under various input conditions is shown in FIG. 2. Between 0 and 1 μs, adata is low while aload is taken high, so circuitry 10 performs an asynchronous load of a 0 (i.e., an asynchronous clear) and q is therefore low. Between 1 μs and 4 μs, aload has been returned to low, so circuitry 10 is in normal synchronous operation and q follows sdata in synchronization with the leading edge of clock. Between 4 μs and 5 μs, aload is taken high, causing circuitry 10 to asynchronously load a 0 (i.e., to asynchronously clear) independent of the value of sdata. Between 5 μs and 6 μs, aload is taken low, so circuitry 10 is in normal synchronous operation and q follows sdata in synchronization with the leading edge of clock. Between 6 μs and 7 μs, adata is low while aload is taken high, causing circuitry 10 to perform an asynchronous load of a 0 (i.e., an asynchronous clear), so q goes low. Between 7 μs and 8 μs, adata is high while aload is high, causing circuitry 10 to perform an asynchronous load of a 1 (i.e., an asynchronous set), so q is high. Between 8 μs and 9 μs, adata is low and aload is high, causing circuitry 10 to perform an asynchronous load of a 0 (i.e., an asynchronous clear), so q is low. After 9 μs, aload and adata are both low, so circuitry 10 is in normal synchronous operation and q follows sdata in synchronization with the leading edge of clock.

Circuitry 10 of FIG. 1 illustrates aspects of the invention related to providing an asynchronous loading capability to a register that is incapable of asynchronous loading. However, circuitry 10 does not include circuitry for suppressing glitches that might occur at the output q during certain operating conditions. FIGS. 3–8 illustrate the use of glitch (hazard) suppression circuitry in addition to circuitry for emulating asynchronous loading capabilities.

Figure 3:
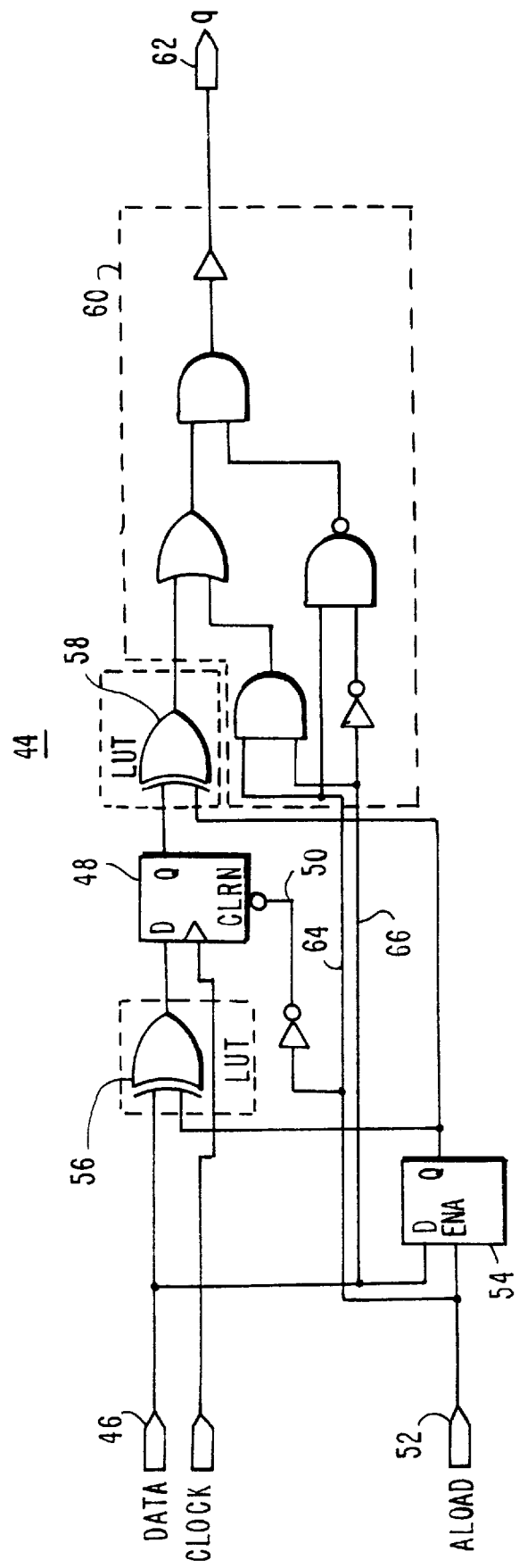
FIG. 3 is a circuit diagram of an illustrative embodiment of the present invention in which a single data input is used to provide data to both the synchronous and asynchronous data paths.

FIG. 3 shows circuitry 44 similar to circuitry 10 of FIG. 1 in which the separate synchronous data (sdata) and asynchronous data (adata) inputs have been combined into the single data input 46. Like circuitry 10 of FIG. 1, circuitry 44 of FIG. 3 has register 48, which does not have asynchronous set capabilities, but only has the ability to be asynchronously cleared via input 50.

When it is desired to load data asynchronously, asynchronous data is provided to input 46 and the value of aload at input 52 is taken high. This causes the asynchronous data at input 46 to be provided at the Q output of latch 54. Exclusive OR gates 56 and 58 selectively function as non-inverting buffers or as inverters, depending on whether Q of latch 54 is low or high, respectively. Circuitry 44 can be asynchronously cleared when gates 56 and 58 are functioning as non-inverting buffers and can be asynchronously set when gates 56 and 58 are functioning as inverters.

Latch 54 stores the value of the most recent asynchronous operation, reflecting whether the operation was an asynchronous clear or an asynchronous set. This maintains the configuration of exclusive OR gates 56 and 58 (i.e., both inverting or both non-inverting) after the asynchronous operation. Maintaining the configuration of exclusive OR gates 56 and 58 allows the asynchronous control input (aload) to be removed after an asynchronous operation is performed without creating undesirable transients. If the configuration of exclusive OR gates 56 and 58 were not maintained by latch 54, the output of exclusive OR gate 58 could change abruptly (e.g., from high to low) upon removing the asynchronous control signal aload.

Figure 4:
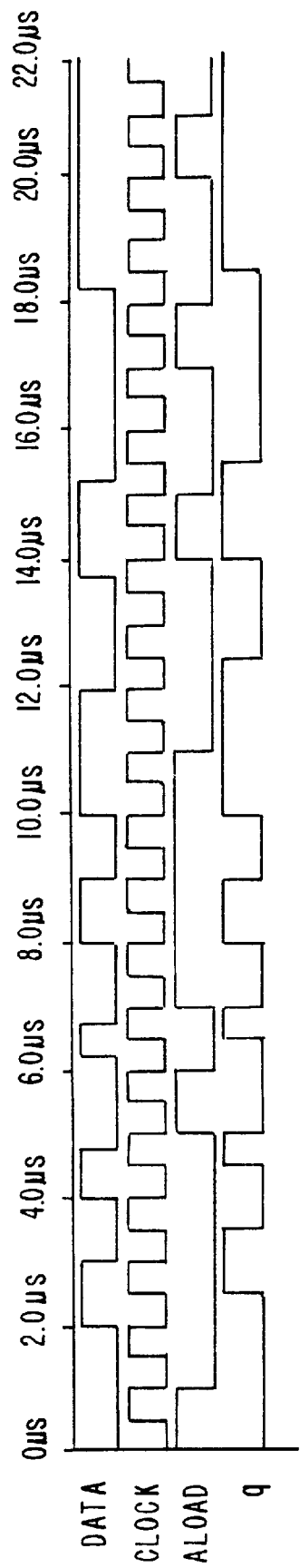
FIG. 4 is a timing diagram showing the operation of the circuit of FIG. 3.

Hazard coverage circuit 60 of circuitry 44 ensures that glitches (hazards) are suppressed during asynchronous operations. Hazard coverage circuit 60 predicts the proper value of q based on the signals aload (received via path 64) and data (received via path 66). Hazard coverage circuit 60 enforces this prediction during asynchronous operations (when aload is high), thereby providing a glitch-suppressed output signal at output 62. During synchronous operations (when aload is low), the output of exclusive OR gate 58 is passed through to output 62 unchanged. FIG. 4 illustrates the operation of circuitry 44 under a variety of input conditions, during which hazard coverage circuit 60 prevents glitches from appearing at output 62.

Figure 5:
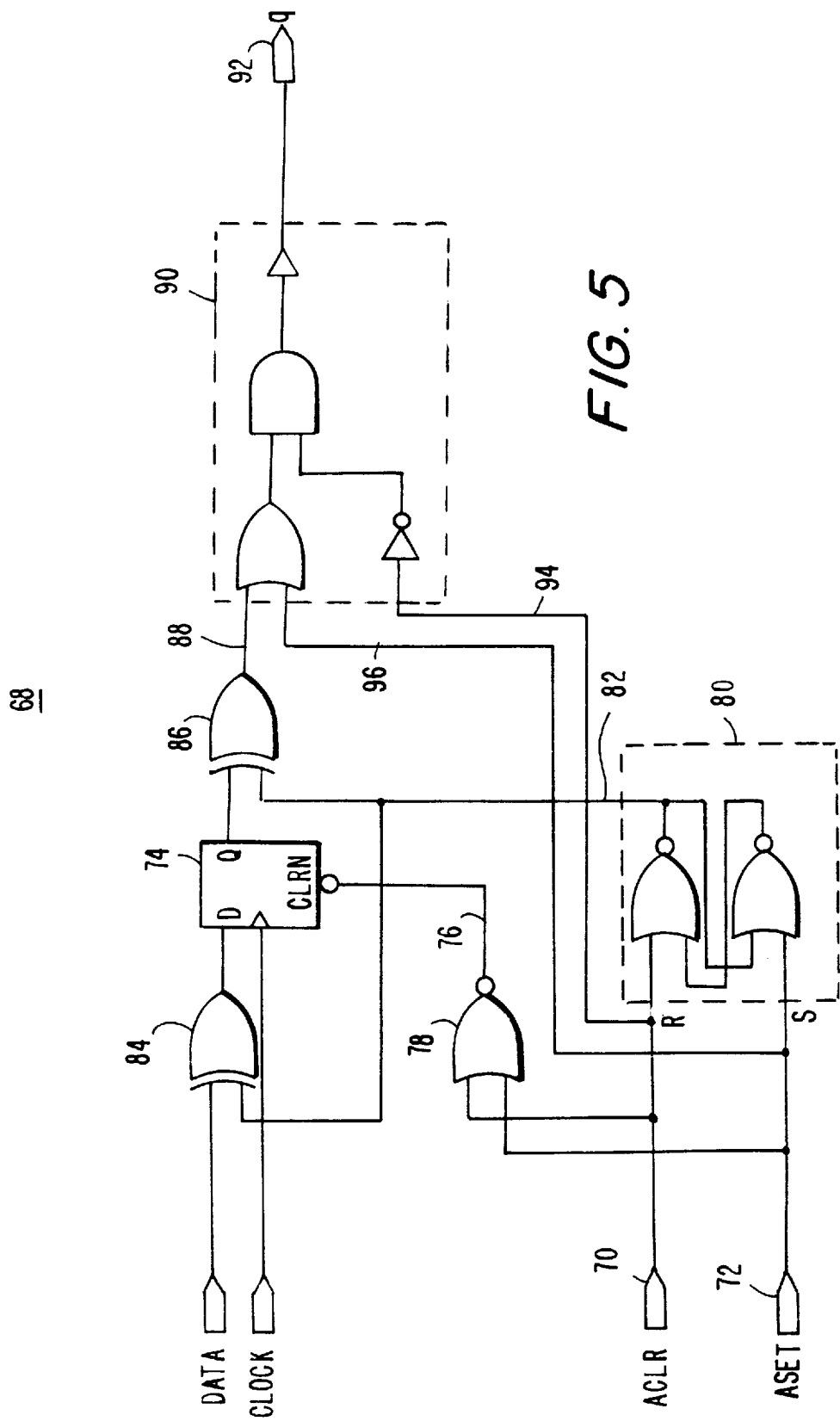
FIG. 5 is a circuit diagram of an illustrative embodiment of the present invention in which dedicated inputs are used to control both asynchronous clear and asynchronous set operations.

FIG. 5 shows another illustrative embodiment of the present invention. Circuitry 68 of FIG. 5 is similar to circuitry 44 of FIG. 3, except the asynchronous control inputs of adata (asynchronous data) and aload (asynchronous load) of circuitry 44 have been replaced by the asynchronous control inputs of aclr 70 (asynchronous clear) and aset 72 (asynchronous set) in circuitry 68. Like circuitry 44 of FIG. 3, circuitry 68 of FIG. 5 has register 74, which does not have asynchronous set capabilities, but only has the ability to be asynchronously cleared via input 76.

When it is desired to clear circuitry 68 asynchronously (i.e., load a 0), aclr input 70 is taken high while aset input 72 is held low. NOR gate 78 inverts the aclr signal, so input 76 is taken low and register 74 is cleared (i.e., its contents and output go low). Latch circuit 80 forms an R-S latch in which aclr input 70 is the reset (R) input and aset input 72 is the set (S) input. Taking aclr high while aset is low resets latch circuit 80, so that latch output 82 is low. The low signal from latch output 82 is provided to exclusive OR gates 84 and 86. Exclusive OR gates 84 and 86 function as non-inverting buffers when latch output 84 is low, so the low Q output of cleared register 74 is passed to output 88. Hazard coverage circuit 90 ensures that glitches are suppressed during asynchronous operations. Hazard coverage circuit 90 predicts the proper value of q at output 92 based on the signals aclr (received via path 94) and aset (received via path 96). Hazard coverage circuit 90 enforces this prediction during asynchronous operations (when aclr or aset is high), thereby providing a glitch-suppressed output signal at output 92. During synchronous operations (when aclr and aset are low), output 88 of exclusive OR gate 86 is passed through to output 92 unchanged.

Figure 6:
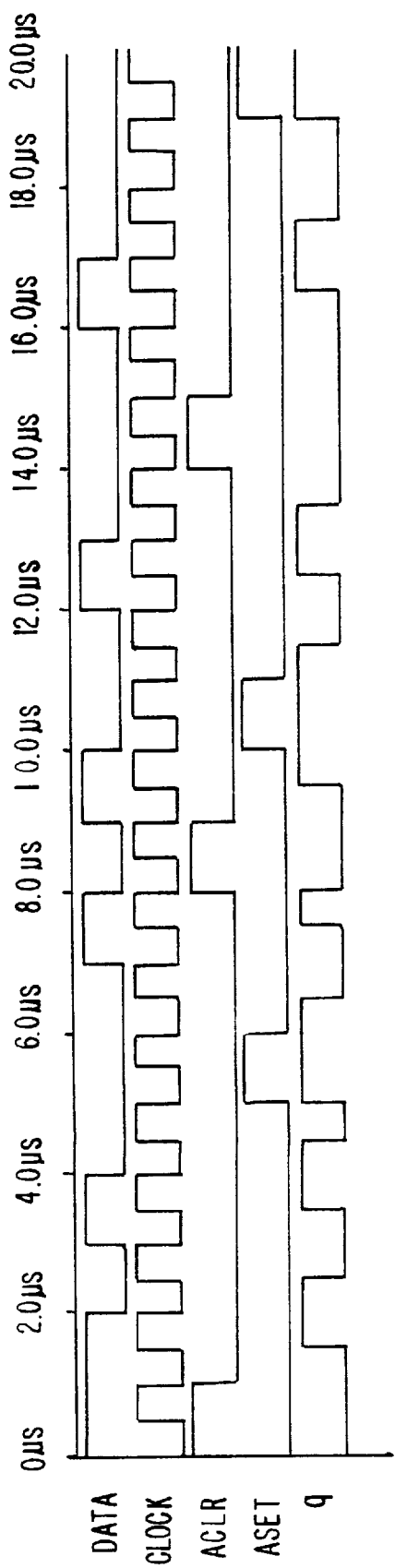
FIG. 6 is a timing diagram showing the operation of the circuit of FIG. 5.

When it is desired to set circuitry 68 asynchronously (i.e., load a 1), aset input 72 is taken high while aclr input 70 is held low. NOR gate 78 inverts the aset signal, so that input 76 is taken low and register 74 is cleared (i.e., its contents and output go low). Taking aset high while aclr is low sets latch circuit 80, so that latch output 82 is high. The high signal from latch output 82 is provided to exclusive OR gates 84 and 86. Exclusive OR gates 84 and 86 function as inverters when latch output 84 is high, so that the low output of cleared register 74 is inverted by exclusive OR gate 86 before being provided at output 88. Hazard coverage circuit 90 predicts the proper value of q at output 92 based on the signals aclr and aset. FIG. 6 illustrates the operation of circuitry 68 under a variety of input conditions, during which hazard coverage circuit 90 prevents glitches from appearing at output 92.

Because latch output 82 of circuitry 68 (FIG. 5) is provided to both exclusive OR gate 84 and exclusive OR gate 86, the full synchronous functionality of register 74 is maintained by circuitry 68 following either an asynchronous clear or asynchronous set operation. In addition, latch circuit 80 stores the value of the most recent asynchronous operation, reflecting whether the operation was an asynchronous clear or an asynchronous set. This maintains the configuration of exclusive OR gates 84 and 86 fixed after the asynchronous operation. Maintaining the configuration of exclusive OR gates 84 and 86 fixed allows the asynchronous control inputs (aclr 70 and aset 72) to be removed after an asynchronous operation is performed without generating undesired transient signals (e.g., at the output of exclusive OR gate 86).

Figure 7:
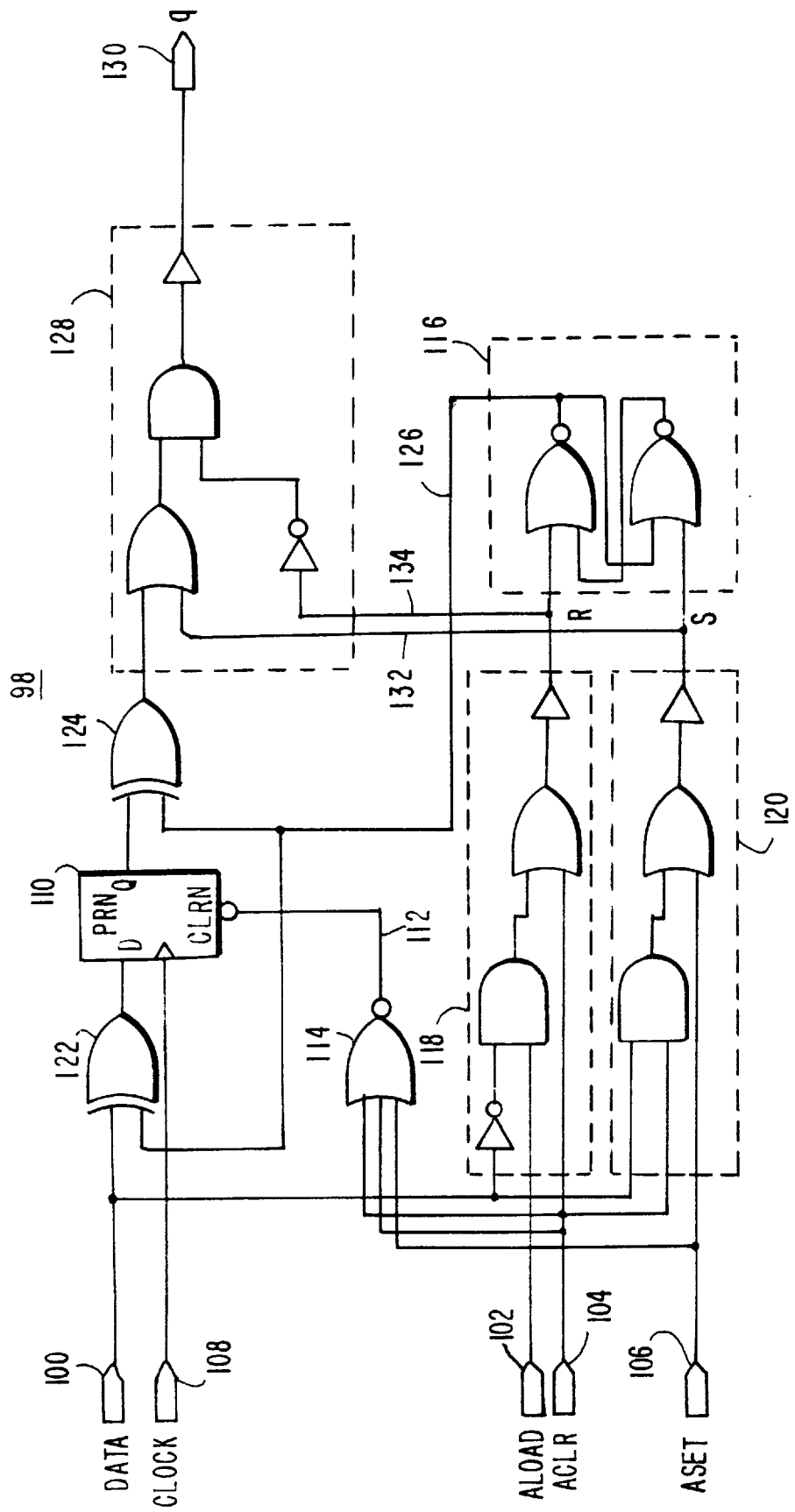
FIG. 7 is a circuit diagram of an illustrative embodiment of the present invention which provides asynchronous clear, asynchronous set, asynchronous data, and asynchronous load inputs.

FIG. 7 shows another illustrative embodiment of the present invention. Circuitry 98 of FIG. 7 combines the control arrangement of circuitry 44 of FIG. 3 (which uses an aload control input and a common data control input) with the control arrangement of circuitry 68 of FIG. 5 (which uses an aclr control input and an aset control input). If desired, circuitry 98 can be asynchronously loaded using data input 100 and aload input 102 in the same way that the data and aload inputs are used in circuitry 44 of FIG. 3. During asynchronous loading using data input 100 and aload input 102, aclr input 104 and aset input 106 are held low. Circuitry 98 can also be asynchronously loaded using aclr input 104 and aset input 106 in the same way that the aclr and aset inputs are used in circuitry 68 of FIG. 5. During asynchronous operations involving aclr input 104 and aset input 106, aload input 102 is held low. Clock input 108 is used to provide clock signals. Circuitry 98 supports normal synchronous operations when aload input 102, aclr input 104, and aset input 106 are held low.

Register 110 is incapable of performing asynchronous loading operations by itself, because register 110 only has the ability to be asynchronously cleared via input 112, not the ability to be asynchronously set. NOR gate 114 takes input 112 low and clears register 110 whenever any one of aload input 102, aclr input 104, or aset input 106 goes high (i.e., during any asynchronous operation).

Latch circuit 116 forms an R-S latch similar to latch circuit 80 of circuitry 68 of FIG. 5. When it is desired to asynchronously set or clear circuitry 98 using aclr input 104 or aset input 106, aload input 102 is held low. With aload input 102 held low, latch circuit 116 can be set and reset using aclr input 104 and aset input 106 in the same way that latch circuit 80 of FIG. 5 is set and reset by its aclr and aset inputs. With aload low, circuits 118 and 120 pass the aclr and aset signals directly to the R and S inputs of latch circuit 116.

When it is desired to asynchronously load circuitry 98 using data input 100 and aload input 102, aclr input 104 and aset input 106 are held low. With aclr input 104 and aset input 106 held low, latch circuit 116 can be set and reset using data input 100 and aload input 102. With aclr input 104 and aset input 106 held low, circuit 118 translates data input 100 and aload input 102 into a reset signal that is applied to the R (reset) input of latch circuit 116 and circuit 120 translates data input 100 and aload input 102 into a set signal that is applied to the S (set) input of latch circuit 116.

Regardless of whether latch circuit 116 is loaded by using aclr and aset or by using data and aload, latch output 126 is provided to exclusive OR gates 122 and 124, which selectively act as non-inverting buffers or as inverters. When exclusive OR gate 124 acts as a non-inverting buffer, circuitry 98 can be asynchronously cleared by clearing register 110. When exclusive OR gate 124 acts as an inverter, circuitry 98 can be asynchronously set by clearing register 110. Exclusive OR gate 122 mirrors the state of exclusive OR gate 124 (i.e., inverting or non-inverting), so that the normal synchronous operation of register 110 is preserved following asynchronous operations.

Figure 8:
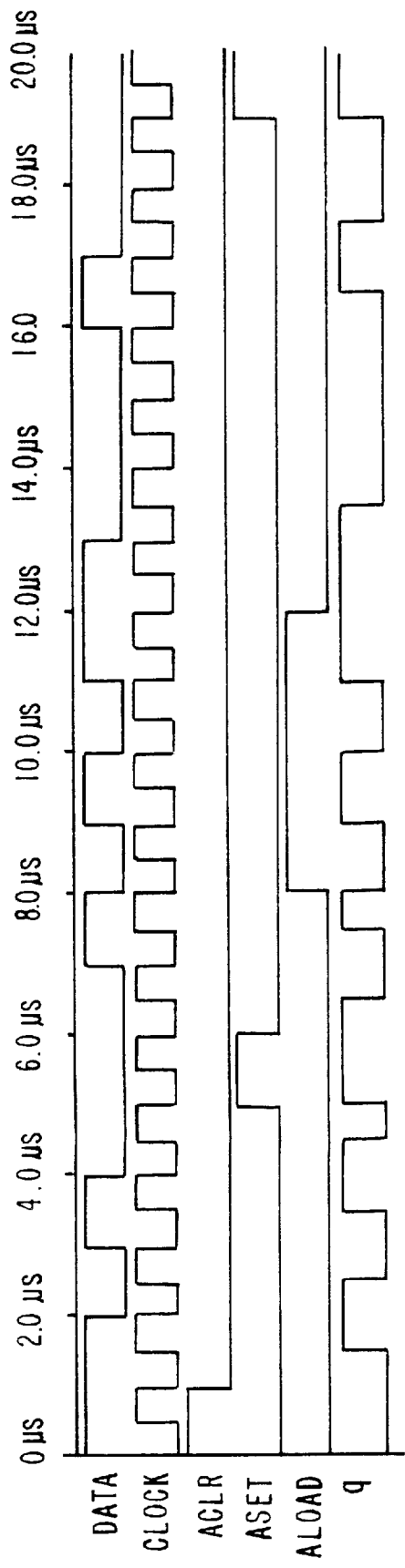
FIG. 8 is a timing diagram showing the operation of the circuit of FIG. 7.

Hazard coverage circuit 128 ensures that glitches are suppressed during asynchronous operations. Hazard coverage circuit 128 predicts the proper value of q at output 130 based on the asynchronous control signals received via paths 132 and 134. Hazard coverage circuit 128 enforces this prediction during asynchronous operations (when aload, aclr, or aset is high), thereby providing a glitch-suppressed output signal at output 130. During synchronous operations (when aload, aclr, and aset are low), the output of exclusive OR gate 124 is passed to output 130 unchanged. FIG. 8 illustrates the operation of circuitry 98 under a variety of input conditions, during which hazard coverage circuit 128 prevents glitches from appearing at output 130.

Latch circuit 116 of circuitry 98 (FIG. 7) stores the value of the most recent asynchronous operation, reflecting whether that operation was an asynchronous clear or an asynchronous set. This maintains the configuration of exclusive OR gates 122 and 124 (i.e., both inverting or both non-inverting) after the asynchronous operation. Maintaining the configuration of exclusive OR gates 122 and 124 fixed allows the asynchronous inputs (aload, aclr, and aset) to be removed after an asynchronous operation is performed. If the configuration of exclusive OR gates 122 and 124 were not retained by latch circuit 116, the output of exclusive OR gate 124 could change abruptly (e.g., from high to low) upon removing the asynchronous control input signals.

The circuitry of FIGS. 1, 3, 5, and 7 other than registers 12, 48, 74, and 110 can be formed using programmable logic. For example, programmable look-up tables such as look-up tables 40, 42, and 43 of FIG. 1 may be used to implement the functions of the various exclusive OR gates, latches, hazard control circuitry, etc. shown in FIGS. 1, 3, 5, and 7. Using programmable logic allows programmable resources to be reused when they are not required to form the asynchronous loading circuitry of FIGS. 1, 3, 5, and 7.

Suitable programmable logic devices for implementing circuitry such as the circuitry of FIGS. 1, 3, 5, and 7 may use programmable logic connectors to interconnect various circuit components. Such programmable logic connectors can be relatively simple programmable connectors such as switches for connecting any one of several inputs to an output or may be more complex elements which are capable of performing logic as well as making a connection. For example, programmable logic connectors can be product term logic, implementing functions such as AND, NAND, OR, or NOR. Examples of components suitable for implementing programmable logic connectors are EPROMs, EEPROMs, pass transistors, transmission gates, antifuses, laser fuses, metal optional links, etc. The components of programmable logic connectors can be controlled by various, programmable, function control elements. (With certain programmable logic connector implementations (e.g., fuses and metal optional links) separate functional control element devices are not required.) Functional control elements can also be implemented in any of several different ways. For example, functional control elements can be static random-access memory (SRAM) elements, dynamic random-access memory (DRAM) elements, first-in first-out ("FIFO") memories, erasable programmable read-only memory (EPROM) elements, electrically-erasable programmable read-only memory (EEPROM) elements, function control registers (e.g., as in Wahlstrom U.S. Pat. No. 3,473, 160), ferro-electric memory elements, fuses, antifuses, or the like. From the various examples mentioned above it will be seen that this invention is applicable both to one-time-only programmable and reprogrammable devices.

Figure 9:
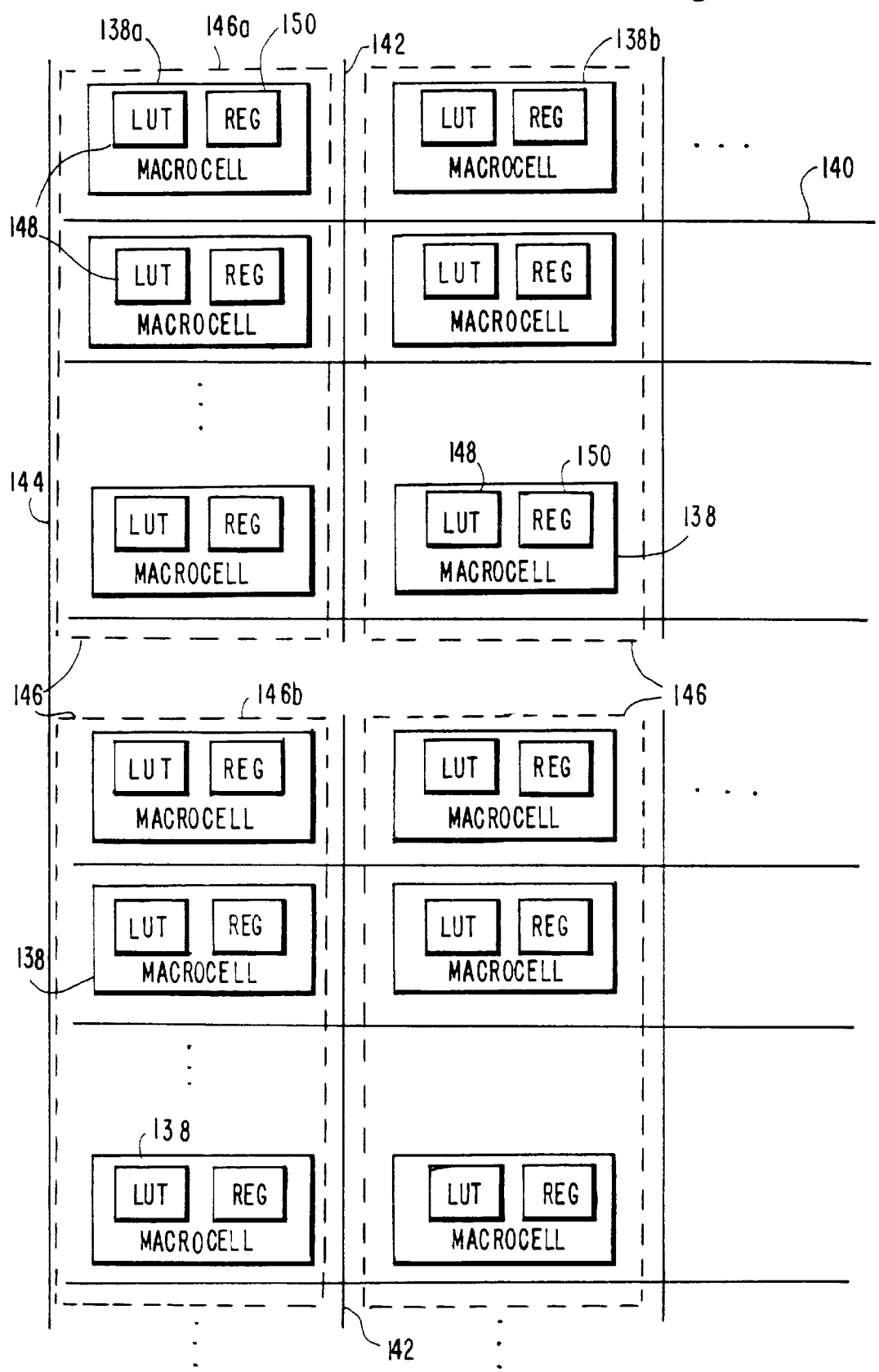
FIG. 9 is an illustrative programmable logic device containing the asynchronous loading circuitry of the present invention.

An illustrative programmable logic device for implementing the circuitry of the present invention is shown in FIG. 9. Programmable logic device 136 is made up of a plurality of rows and columns of macrocells 138, which are interconnected by various horizonal and vertical conductors. For example, macrocells 138a and 138b are interconnected by horizontal conductor 140. Vertical conductors 142 interconnect macrocells 138 that are arranged in logic array blocks 146. Global vertical conductors 144 are used to interconnect logic array blocks such as logic array blocks 146a and 146b. (The connections between macrocells 138 and conductors 140, 142, and 144 and various other interconnections and details are not shown in FIG. 9 to avoid over-complicating the drawing).

Each macrocell 138 contains a programmable look-up table 148 and a register 150. Registers 150 are incapable of performing asynchronous loading, but may be provided with circuitry such as shown in FIGS. 1, 3, 5, and 7 to provide asynchronous loading capabilities using the programmable circuit resources of look-up tables 148. For example, look-up tables 148 in the same logic array block 146 as a given register 150 may be used to provide that register with asynchronous loading functions.

Figure 10:
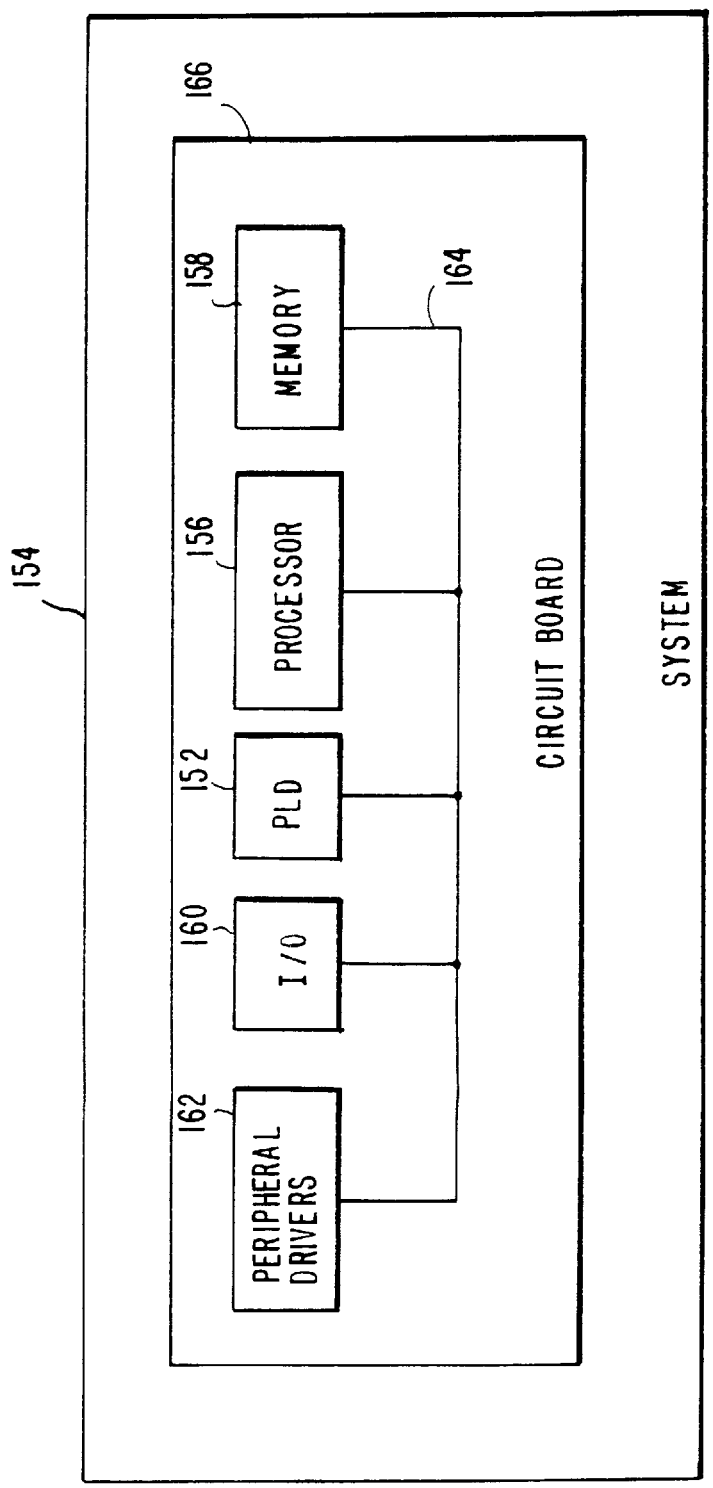
FIG. 10 is a diagram of an illustrative data processing system in which a programmable logic device such as the programmable logic device of FIG. 9 may be used.

FIG. 10 illustrates a programmable logic device 152 containing circuitry such as circuitry 10, 44, 68, and 98 of this invention in a data processing system 154. Data processing system 154 may include one or more of the following components: a processor 156, memory 158, I/O circuitry 160, and peripheral drivers 162. These components are coupled together by a system bus 164 and populate a circuit board 166 which is contained in system 154.

System 154 can be used in a wide variety of applications, such as computer networking, data networking, instrumentation, video processing, digital signal processing, or any other application where the advantage of using reprogrammable logic is desirable. Programmable logic device 152 can be used to perform a variety of different logic functions. For example, programmable logic device 152 can be configured as a processor or controller that works in cooperation with processor 156. Programmable logic device 152 may also be used as an arbiter for arbitrating access to a shared resource in system 154. In yet another example, programmable logic device 152 can be configured as an interface between processor 156 and one of the other components in system 154.

Although the circuitry of FIGS. 1, 3, 5, and 7 has been described in connection with registers 12, 48, 74, and 110 that have only asynchronous clear functions, the same type of circuit arrangements may be used to emulate asynchronous loading functions for registers that have only asynchronous set functions. As defined herein, the term register asynchronous control input refers to a control input used to perform either an asynchronous clear operation or an asynchronous set operation.

The foregoing is merely illustrative of the principles of this invention and various modifications can be made by those skilled in the art without departing from the scope and spirit of the invention.

What is claimed is:

1. Asynchronously loadable register circuitry having a circuit data input and a circuit data output, comprising:

a register without asynchronous loading capabilities having a register data input, a register data output, and a register asynchronous control input;

a storage circuit having two storage circuit inputs and a storage circuit output;

a first logic gate having one input coupled to the circuit data input and another input coupled to the storage circuit output and having an output coupled to the register data input; and a second logic gate having one input coupled to the register data output and another input coupled to the storage circuit output and having an output coupled to the circuit data output, the first and second logic gates acting as non-inverting buffers when the storage circuit output has a first value and acting as inverters when the storage circuit output has a second value.

2. The circuitry defined in claim 1 further comprising an asynchronous data input coupled to one of the storage circuit inputs and an asynchronous load input coupled to the other storage circuit input.

3. The circuitry defined in claim 2 wherein the asynchronous data input is connected to the circuit data input.

4. The circuitry defined in claim 2 wherein the asynchronous load input is coupled to the register asynchronous control input.

5. The circuitry defined in claim 4 wherein the asynchronous load input is coupled to the register asynchronous control input by an inverter.

6. The circuitry defined in claim 4 wherein the asynchronous load input is coupled to the register asynchronous control input by a NOR gate.

7. The circuitry defined in claim 2 wherein the storage circuit comprises a latch having an enable input and a data input, the asynchronous load input being connected to the enable input and the asynchronous data input being connected to the data input.

8. The circuitry defined in claim 1 further comprising an asynchronous clear input coupled to one of the storage circuit inputs and an asynchronous set input coupled to the other storage circuit input.

9. The circuitry defined in claim 8 wherein the asynchronous clear input is coupled to the register asynchronous control input.

10. The circuitry defined in claim 9 wherein the asynchronous clear input is coupled to the register asynchronous control input by a NOR gate.

11. The circuitry defined in claim 8 wherein the asynchronous set input is coupled to the register asynchronous control input.

12. The circuitry defined in claim 11 wherein the asynchronous set input is coupled to the register asynchronous control input by a NOR gate.

13. The circuitry defined in claim 8 wherein the storage circuit comprises a latch having a reset input and a set input, the asynchronous clear input being coupled to the reset input and the asynchronous set input being coupled to the set input.

14. The circuitry defined in claim 13 wherein the asynchronous clear input is directly connected to the reset input of the latch and the asynchronous set input is directly connected to the set input of the latch.

15. The circuitry defined in claim 13 wherein the asynchronous clear input and the asynchronous set input are coupled to the register asynchronous control input by a NOR gate.

16. The circuitry defined in claim 15 further comprising:

an asynchronous load input coupled to the register asynchronous control input by the NOR gate; and an asynchronous data input.

17. The circuitry defined in claim 16 further comprising:

a first circuit for coupling the asynchronous clear input and the asynchronous load input to the reset input of the latch; and a second circuit for coupling the asynchronous set input and the asynchronous data input to the set input of the latch, so that the latch is set and reset by one of: (a) the asynchronous clear input and asynchronous set input and (b) the asynchronous data input and the asynchronous load input.

18. The circuitry defined in claim 1 wherein the register asynchronous control input is a clear input.

19. The circuitry defined in claim 1 further comprising a hazard coverage circuit coupled between the output of the second logic gate and the circuit data output.

20. The circuitry defined in claim 1 wherein the first logic gate is an exclusive OR gate.

21. The circuitry defined in claim 1 wherein the second logic gate is an exclusive OR gate.

22. The circuitry defined in claim 1 further comprising programmable logic in which the first and second gates are implemented.

23. The circuitry defined in claim 1 further comprising:

a first look-up table in which the first logic gate is implemented; and a second look-up table in which the second logic gate is implemented.

24. A digital processing system comprising:

a processor;

a memory coupled to the processor; and a programmable logic device coupled to the processor and the memory, the programmable logic device including asynchronously loadable register circuitry having:

a circuit data input, a circuit data output, a register without asynchronous loading capabilities having a register data input, a register data output, and a register asynchronous control input, a storage circuit having two storage circuit inputs and a storage circuit output, a first logic gate having one input coupled to the circuit data input and another input coupled to the storage circuit output and having an output coupled to the register data input, and a second logic gate having one input coupled to the register data output and another input coupled to the storage circuit output and having an output coupled to the circuit data output, the first and second logic gates acting as non-inverting buffers when the storage circuit output has a first value and acting as inverters when the storage circuit output has a second value.

\* \* \* \* \*